United States Patent [19]

Man et al.

[11] Patent Number: 5,670,871
[45] Date of Patent: Sep. 23, 1997

[54] POLYMERIC FILM ELECTROOPTIC SENSOR DEVICE

[76] Inventors: Hong-Tai Man, 24 Hapmton Ct., Basking Ridge, N.J. 07920; Iain A. McCulloch, 30 Southgate Rd., Apt. 2A, Murray Hill, N.J. 07974; Hyun-Nam Yoon, 88 Clochester Rd., New Providence, N.J. 07974

[21] Appl. No.: 683,079

[22] Filed: Jul. 16, 1996

Related U.S. Application Data

[63] Continuation of Ser. No. 234,490, Apr. 28, 1994.
[51] Int. Cl.$^6$ ................................................ G01R 31/00
[52] U.S. Cl. .................... 324/96; 324/753; 359/245; 359/257
[58] Field of Search ................ 324/753, 96, 244.1; 359/245–248, 250–252, 254–257, 259, 262, 263

[56] References Cited

U.S. PATENT DOCUMENTS

| | | | |
|---|---|---|---|
| 4,910,454 | 3/1990 | Williamson | 324/76.36 |
| 4,926,043 | 5/1990 | Solkner | 250/231.1 |
| 5,053,168 | 10/1991 | Man et al. | 252/587 |
| 5,093,883 | 3/1992 | Yoon et al. | 385/130 |
| 5,155,617 | 10/1992 | Solgaard et al. | 359/245 |
| 5,272,434 | 12/1993 | Meyrueix et al. | 324/751 |

*Primary Examiner*—Vinh P. Nguyen
*Assistant Examiner*—Russell M. Kobert
*Attorney, Agent, or Firm*—Palaiyor S. Kalyanaraman

[57] ABSTRACT

This invention provides an electrooptic sensor device which is adapted to measure micro-circuit electrical signals with subpicosecond resolution. The sensor device has an electrooptic organic polymer film matrix. The sensor device is positioned adjacent to an electrical signal transmission line of a micro-circuit, and within a fringe electric field of the transmission line. Birefringence is induced in the electrooptic polymer film matrix by the fringe electric field generated by a propagation electrical signal in the transmission line. An optical probe beam of focused electrical signal-synchronized laser pulses of picosecond range duration is beamed into the birefringent polymer film matrix, and the output laser pulses are processed to provide an optical profile measurement of the electrical signal.

18 Claims, 2 Drawing Sheets

POLYMERIC FILM ELECTROOPTIC SENSOR DEVICE

This is a continuation of application Ser. No. 08/234,490 filed on Apr. 28, 1994 now pending.

BACKGROUND OF THE INVENTION

Sampling of an electrical signal with picosecond temporal resolution has been accomplished with the use of an electrooptic sensor device made up of an electrooptic crystal of lithium niobate or lithium tantalate which has a microwave strip transmission line on its surface for the signals. This system is described in U.S. Pat. No. 4,446,425. The system is also the subject of an article entitled "Picosecond Electrooptic Sampling System" by J. S. Valdmanis et al, Appl. Phys. Lett., Vol. 41–3, 211, August 1982.

Electrooptical sampling systems using the Pockels effect are capable of measuring signals containing frequencies up to many hundreds of gigahertz, with resolution in the picosecond range down to 0.5 picoseconds. However, it is desirable to extend further the frequency range and the resolution of such electrooptic samplers. It is also desirable to provide electrooptic sampling where the transmission line is separate from the crystal, so that electrical signals which are propagating in transmission lines, such as conductors on integrated circuit chip substrates, may be measured with high resolution.

U.S. Pat. No. 4,603,293 and U.S. Pat. No. 4,618,819 describe electrooptic sensor devices that extend the frequency range and the temporal resolution of electrooptic sampling through the use of the fringe field of a transmission line along which the electrical signals to be measured propagate. The crystal is disposed in the field and the optical beam is passed through the crystal oriented so that a component of its optical field is in parallel relationship with the field at a localized sampling point in the crystal.

The transmission line may be a coplanar transmission line having a plurality of strips of conductive material disposed on a surface of the crystal. The optical sampling beam is focused so that its cofocal region, where the optical wave front is planar, preferably is close to the surface and perpendicular to the optical axis of the crystal. The coplanar waveguide which supports the transmission of electrical signals in the tetrahertz range can easily be formed on the surface of the crystal, and the sampling system is operable to measure signals with a bandwidth expanding to the tetrahertz range and with subpicosecond resolution.

There is continuing interest in the development of new and improved sensor devices which have increased sensitivity for measurement of electrical signals in micro-circuitry.

Accordingly, it is an object of this invention to provide an electrooptic sensor device with an electrooptic organic polymer film matrix.

It is a further object of this invention to provide an electrooptic sensor device having a grounded conductive barrier zone which confines a fringe electric field penetration to an electrooptic organic polymer matrix, and having increased sensitivity for measurement of propagating signal voltage in micro-circuitry.

Other objects and advantages of the present invention shall become apparent from the accompanying description and drawings.

DESCRIPTION OF THE INVENTION

One or more objects of the present invention are accomplished by the provision of an electrooptic sensor device using a Pockels effect for measuring electrical signals with subpicosecond resolution which comprises (1) an optically-transparent thin support substrate; (2) an optically-transparent electrically-conductive coating on a support substrate surface, with means for electrical grounding of the conductive coating; and (3) an electrooptic organic polymer film which is in coextensive contact with the outer surface of the conductive coating; wherein the device is adapted for positioning adjacent to an electrical signal transmission line and within a fringe electric field of the transmission line, and wherein the refractive index of the electrooptic polymer film modulates by Pockels effect in response to the fringe electric field produced by a transmission line electrical signal, and the electrooptic polymer film is adapted for passage of an optical probe beam of focused electrical signal-synchronized laser pulses of picosecond range duration in a direction transverse to the direction of said electric field, and the output laser beam pulses are processed to provide an optical profile measurement of the electrical signal.

In another embodiment this invention provides a method for measuring an electrical signal propagating in a micro-circuit conductor with subpicosecond resolution by means of electrooptic device sensing of a fringe electric field formed by the propagating electrical signal, which method comprises (1) juxtaposing an optically-transparent electrooptic organic polymer film matrix of the electrooptic device adjacent to the micro-circuit substrate so that the fringe electric field creates a Pockels effect birefringence in the polymer film matrix, (2) passing through the polymer matrix an optical probe beam of focused electrical signal-synchronized laser pulses of picosecond range duration in a direction transverse to the direction of said electric field, and (3) processing the output laser beam pulses to provide an optical profile measurement of the electrical signal; wherein the electrooptic sensor device comprises (a) an optically-transparent thin support substrate; (b) an optically-transparent electrically-conductive coating on a support substrate surface, with means for electrical grounding of the conductive coating; and (c) the optically-transparent electrooptic organic polymer film matrix which is in coextensive contact with the outer surface of the conductive coating.

The term "optically-transparent" as employed herein refers to electrooptic sensor device strata which are light transmitting with respect to both input laser beam pulses into an invention sensor device and reflected output laser beam pulses.

Figure 1:
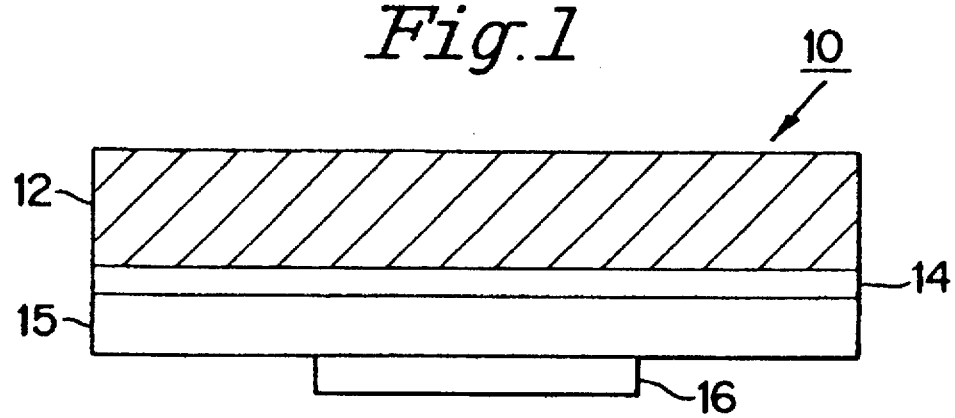
FIG. 1 is an enlarged sectional view which illustrates a fabrication stage of a an electrooptic sensor device which has a combination of two functioning electrodes.

Referring to FIG. 1, an electrooptic sensor device is fabricated employing materials and procedures described in publications which include U.S. Pat. Nos. 4,877,298; 4,936,645; 5,039,186; 5,093,883; 5,106,211; and 5,170,461; incorporated by reference.

In FIG. 1, the electrooptic sensor device is fabricated by covering optically-transparent thin support substrate 12 with optically-transparent electrically-conductive coating 14. Substrate 12 can be glass, and conductive coating 14 can be a metal oxide such as indium-tin oxide or indium-antimony oxide.

Electrooptic organic polymer film matrix 15 is deposited on conductive coating 14 by spin-coating with an organic solvent solution of the organic polymer. A preferred film thickness is between about 0.1–1000 microns. Suitable polymers include side chain polymers such as copolymers of alkyl acrylate or alkyl methacrylate with one or more monomers which include N-(2-methacryloyloxyethyl) indoline nitroazobenzene; 4-(6-methacryloyloxyhexyloxy)-4'-nitrostilbene; 6-(4-nitrobiphenyloxy)hexyl methacrylate; 4-[N-(2-methacryloyloxyethyl-N-methylamino]-4'-nitrostilbene; and the like, as disclosed in publications which include U.S. Pat. Nos. 4,762,912; 4,779,961; 4,801,670; 4,808,332; 4,894,066; 5,131,068; and 5,224,196; incorporated by reference.

Side chain polymers can be poled with an electric field to provide an electrooptic matrix with an Electrooptic Coefficient between about 2–45 picometers per volt ($pmV^{-1}$). It is preferred to utilize side chain polymers which can provide an electrooptic matrix with an Electrooptic Coefficient above about 40 picometers per volt at 1.3 micron wavelength by means of electric field poling of the matrix. Superior electrooptic properties are achieved with side chain polymers which have a number average molecular weight between about 250,000–1,000,000, and which are characterized by inter-chain entanglements. Films of high molecular weight side chain polymers are tough and stress-resistant. Thicker films can be fabricated which have a high dielectric strength, and a high Electrooptic Coefficient. Superior electrooptic properties are exhibited by high molecular weight side chain polymers such as a copolymer of methyl methacrylate and N-(2-methacryloyloxyethyl) indoline azonitrobenzene.

Polymer film matrix 15 in FIG. 1 is poled with an electric field to induce noncentrosymmetry in the film bulk. Poling is accomplished by applying an electric field between conductive coating 14 and electrode 16, while applying an annealing temperature to mobilize the polymer chains. A masking procedure is employed to form electrode 16 on the surface of polymer film matrix 15. Electrode 15 typically is gold or aluminum metal.

Figure 2:
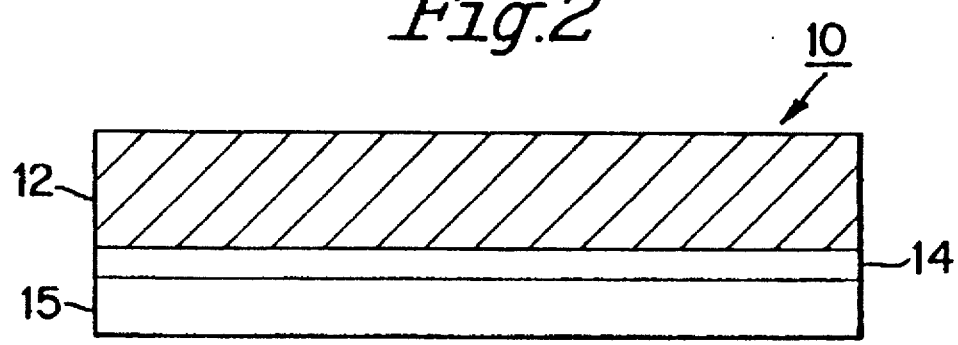
FIG. 2 is an enlarged sectional view of the FIG. 1 device with the removal of the exterior electrode from an electrooptic polymer film surface.
Figure 3:
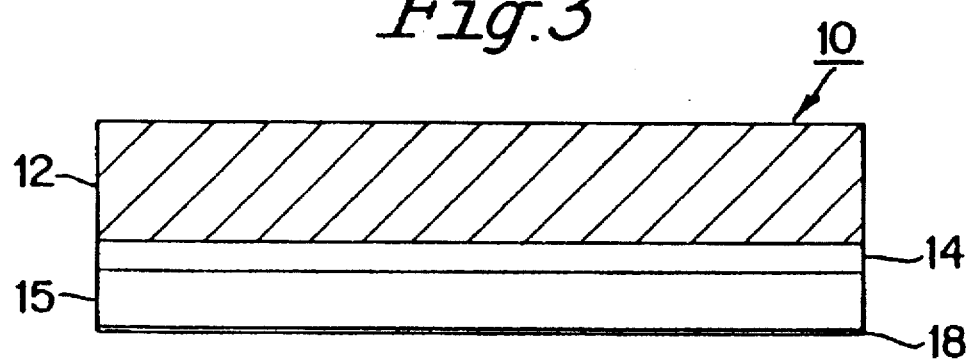
FIG. 3 is an enlarged sectional view of the FIG. 2 cell with a high reflection coating on the outer surface of the electrooptic polymer film.

FIG. 3 illustrates a FIG. 2 type electrooptic sensor device with high reflection cladding 18 on polymer film matrix 15. In a preferred embodiment, electrode 16 in FIG. 1 is deposited as a metal cladding coextensive with the surface of polymer film matrix 15. Electrode 16 in the metal cladding form is not removed, and it serves the function of high reflection cladding 18 in FIG. 3.

Figure 4:
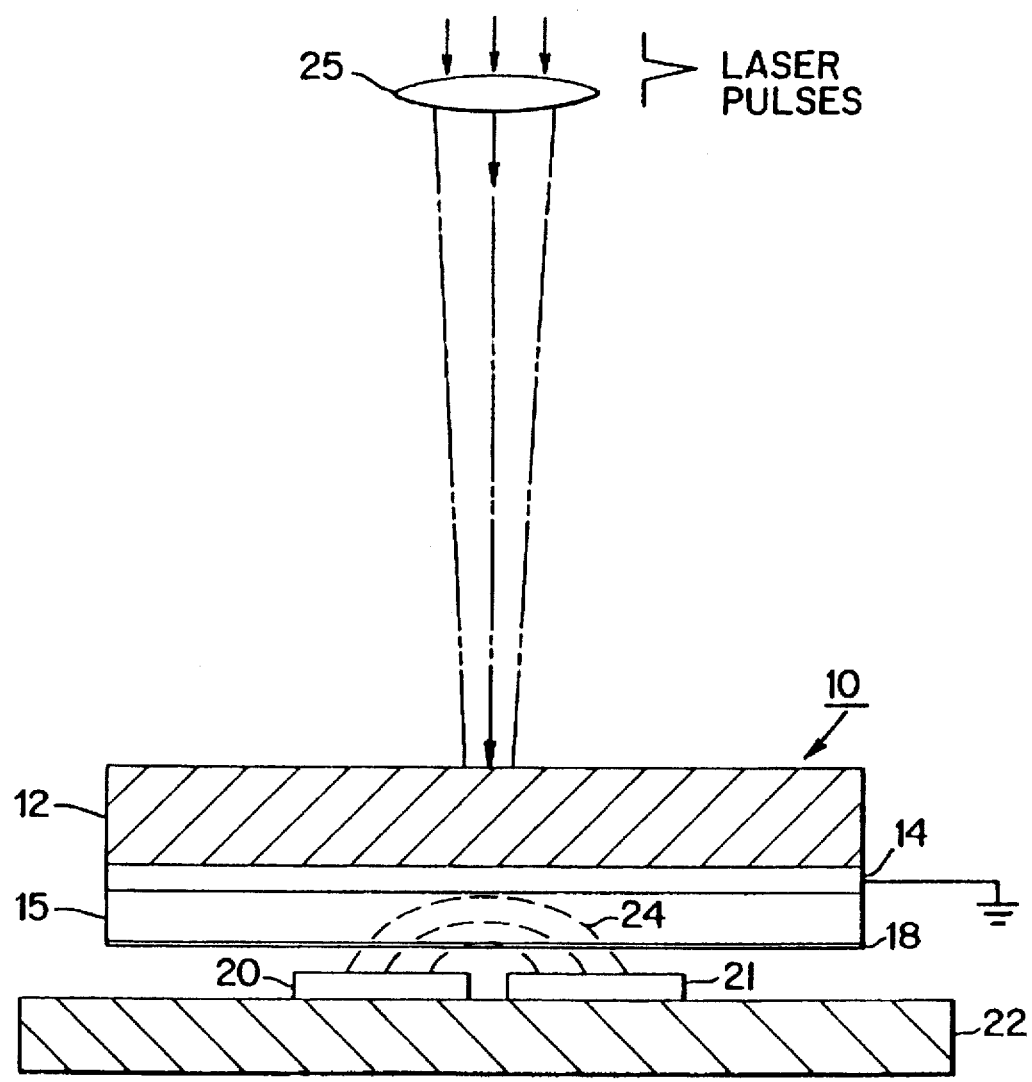
FIG. 4 is an enlarged sectional view illustrating the measurement of electrical signals using a FIG. 3 cell in the fringe electric field of a micro-circuit transmission line, and using an optical probe beam of focused laser pulses to interact with generated birefringence in the electrooptic polymer film matrix.

FIG. 4 illustrates a FIG. 3 electrooptic sensor device which is positioned adjacent to electrical signal transmission line conductors 20 and 21 on an integrated circuit chip substrate 22, and within fringe electric field 24 of transmission lines 20 and 21.

As represented in FIG. 4, electrically-conductive coating 14 is grounded. An important advantage of grounding coating 14 is the confinement of fringe electric field 24 in optically-transparent polymer film matrix 15. Grounding of coating 14 increases the sensitivity of electrooptic sensor device 10, i.e., the electrooptic sensor device can measure micro-circuit electrical signals which have a signal voltage as low as one millivolt. When coating 14 is not grounded, the electrooptic sensor device is not sensitive to a signal voltage which is below about 100 millivolts.

Referring to FIG. 4, electrooptic sensor device 10 typically is utilized in combination with means for generating an optical probe beam of laser pulses synchronous with the electrical signal being measured, and with means for processing the output laser beam pulses to provide an optical profile measurement of the electrical signal. The optical profile measurement can be translated with a display means as a linear voltage versus equivalent time representation of the electrical signal.

A suitable optical pulse generating and optical pulse output processing system is described in U.S. Pat. No. 4,618,819; incorporated by reference. In the system, an optical probe beam is generated in a colliding pulse mode-locked laser pumped by a CW argon laser. The laser generates pulses of about 120 femtoseconds (fs) in duration at a 100 MHz rate. The input optical pulses drive an electric signal source, and also synchronously sample fringe electric field 24 in FIG. 4.

The input pulses pass through a beam splitter and are focused by lens 25 in FIG. 4 to provide a cofocal region of the optical beam in polymer film matrix 15. Fringe electric field 24 penetrates polymer film matrix 15 and induces birefringence. The focused optical beam is oriented so that a component of the optical field and a component of fringe electric field 24 are both parallel to the optical axis of polymer film matrix 15.

The input optical pulses are reflected by the surface of high reflection cladding 18, and the reflected output optical pulses pass in reverse through focusing lens 25. The output optical pulses are directed by a beam splitter to a polarization analyzer. The output optical pulses then go to a compensator to achieve linear response and maximum voltage sensitivity.

The integrated circuit is operated in synchronization with the optical pulses by means of a delay device so as to develop output optical pulses showing the profile of the electrical signals. The use of polarizers and beam splitters can be avoided by tilting the input optical pulse beam relative to polymer film matrix 15 and integrated circuit chip substrate 22 in FIG. 4. The reflected output optical pulse beam then clears focusing lens 25 and travels directly to the compensator device.

What is claimed is:

1. In an electrooptic sensor device using a Pockels effect for measuring electrical signals with subpicosecond resolution, the improvement which comprises (1) an optically-transparent thin support substrate; (2) an optically-transparent electrically-conductive coating on a support substrate surface, with means for electrical grounding of the conductive coating; and (3) an optically-transparent electrooptic organic polymer film matrix which is in coextensive contact with the surface of the conductive coating opposite to said support substrate; wherein the device is adapted for positioning adjacent to an electrical signal transmission line and within a fringe electric field of the transmission line, and wherein the refractive index of the electrooptic polymer film modulates by Pockels effect in response to the fringe electric field produced by a transmission line electrical signal, and the electrooptic polymer film is adapted for passage of an optical probe beam of focused electrical signal-synchronized laser pulses of picosecond range duration in a direction transverse to the direction of said electric field, and the output laser beam pulses are processed to provide an optical profile measurement of the electrical signal, wherein said electrooptic organic polymer is a noncentrosymmetric matrix of an electric field poled side chain polymer which has a number average molecular weight between about 250,000–1,000,000 and is characterized by inter-chain entanglements.

2. An electrooptic sensor device in accordance with claim 1 wherein the thin support substrate is glass.

3. An electrooptic sensor device in accordance with claim 1 wherein the electrically-conductive coating on the support substrate is a metal oxide.

4. An electrooptic sensor device in accordance with claim 1 wherein the electrically-conductive coating on the support substrate is indium-tin oxide or tin-antimony oxide.

5. An electrooptic sensor device in accordance with claim 1 wherein the electrooptic organic polymer film is electric field poled copolymers of alkyl (meth)acrylate and 4-[N-(2-methacryloyloxyethyl)-N-methylamino]-4'-nitrostilbene.

6. An electrooptic sensor device in accordance with claim 1 wherein the electrooptic organic polymer film is electric field poled copolymers of alkyl (meth)acrylate and 4-(6-methacryloyloxyhexyloxy)-4'-nitrostilbene.

7. An electrooptic sensor device in accordance with claim 1 wherein the electrooptic organic polymer film is electric field poled copolymers of alkyl (meth)acrylate and N-(2-methacryloyloxyethyl)indoline azonitrobenzene.

8. An electrooptic sensor device in accordance with claim 1 wherein the electrooptic organic polymer film has an Electrooptic Coefficient above about 40 picometers per volt ($pmV^{-1}$) at 1.3 micron wavelength.

9. An electrooptic sensor device in accordance with claim 1 in which the electrically-conductive coating on the support substrate is grounded.

10. An electrooptic sensor device in accordance with claim 1 in which the outer surface of the electrooptic organic polymer film has a high reflection cladding.

11. An electrooptic sensor device in accordance with claim 1 which is in combination with means for generating an optical probe beam of laser pulses synchronous with the electrical signal being measured, and with means for processing the output laser beam pulses to provide the optical profile measurement of the electrical signal.

12. An electrooptic sensor device in accordance with claim 1 wherein the electrical signal being measured is propagating in a micro-circuit conductor.

13. A method for measuring an electrical signal propagating in a micro-circuit conductor with subpicosecond resolution by means of an electrooptic device sensing of a fringe electric field formed by the propagating electrical signal, which method comprises (1) juxtaposing an optically-transparent electrooptic organic polymer film matrix of the electrooptic device adjacent to the micro-circuit substrate so that the fringe electric field creates a Pockels effect birefringence in the polymer film matrix, (2) passing through the polymer matrix an optical probe beam of focused electrical signal-synchronized laser pulses of picosecond range duration in a direction transverse to the direction of said electric field, and (3) processing the output laser beam pulses to provide an optical profile measurement of the electrical signal; wherein the electrooptic sensor device comprises (a) an optically-transparent thin support substrate; (b) an optically-transparent electrically-conductive coating on a support substrate surface, with means for electrical grounding of the conductive coating; and (c) the optically-transparent electrooptic organic polymer film matrix which is in coextensive contact with the surface of the conductive coating opposite to said support substrate; wherein said electrooptic organic polymer is a noncentrosymmetric matrix of an electric field poled side chain polymer which has a number average molecular weight between about 250,000–1,000,000 and is characterized by inter-chain entanglements.

14. A method in accordance with claim 13 wherein the electrically-conductive coating on the support substrate in the electrooptic sensor device is grounded.

15. A method in accordance with claim 13 wherein the outer surface of electrooptic polymer film matrix in the electrooptic sensor device has a high reflection cladding.

16. A method in accordance with claim 13 wherein the thin support substrate in the electrooptic sensor device is glass.

17. A method in accordance with claim 13 wherein the electrically-conductive coating on the support substrate in the electrooptic sensor device is a metal oxide.

18. A method in accordance with claim 13 wherein the resultant optical profile measurement is displayed as a linear voltage versus equivalent time representation of the electrical signal.

* * * * *

UNITED STATES PATENT AND TRADEMARK OFFICE
CERTIFICATE OF CORRECTION

PATENT NO. : 5,670,871
DATED      : September 23, 1997
INVENTOR(S) : Hong-Tai Man et al It is certified that error appears in the above-identified patent and that said Letters Patent is hereby corrected as shown below:

[73] Assignee: Hoechst Celanese Corporation, Somerville, N.J.

Signed and Sealed this

Seventh Day of April, 1998

Attest:

BRUCE LEHMAN

Attesting Officer    Commissioner of Patents and Trademarks